(12) United States Patent
Nomura et al.

(10) Patent No.: US 7,446,562 B2
(45) Date of Patent: Nov. 4, 2008

(54) PROGRAMMABLE SEMICONDUCTOR DEVICE

(75) Inventors: Masahiro Nomura, Tokyo (JP); Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/628,532

(22) PCT Filed: May 25, 2005

(86) PCT No.: PCT/JP2005/009544

§ 371 (c)(1),
(2), (4) Date: Dec. 5, 2006

(87) PCT Pub. No.: WO01/17112

PCT Pub. Date: Mar. 8, 2001

(65) Prior Publication Data

US 2007/0247188 A1 Oct. 25, 2007

(30) Foreign Application Priority Data

Jun. 15, 2004 (JP) .............................. 2004-176977

(51) Int. Cl.
*H01L 25/00* (2006.01)
*H03K 19/177* (2006.01)

(52) U.S. Cl. .............................. 326/41; 326/47; 326/86
(58) Field of Classification Search .................. 326/39, 326/41, 47
See application file for complete search history.

(56) References Cited

U.S. PATENT DOCUMENTS

| | | | |
|---|---|---|---|
| 5,656,950 A | 8/1997 | Duong et al. | |
| 6,130,550 A * | 10/2000 | Zaliznyak et al. | 326/39 |
| 6,215,326 B1 | 4/2001 | Jefferson et al. | |
| 6,225,822 B1 | 5/2001 | Lane et al. | |
| 6,246,259 B1 | 6/2001 | Zaliznyak et al. | |
| 6,373,280 B1 | 4/2002 | Lane et al. | |
| 6,438,737 B1 | 8/2002 | Morelli et al. | |
| 6,448,810 B1 | 9/2002 | Nomura | |
| 6,480,028 B2 | 11/2002 | Jefferson et al. | |
| 6,507,216 B1 | 1/2003 | Lane et al. | |
| 6,552,410 B1 | 4/2003 | Eaton et al. | |
| 6,679,825 B2 | 1/2004 | Alicea | |
| 6,819,135 B2 | 11/2004 | Lane et al. | |
| 6,879,183 B2 | 4/2005 | Jefferson et al. | |
| 6,900,659 B2 | 5/2005 | Goldfinch | |
| 2001/0006348 A1 | 7/2001 | Jefferson et al. | |

FOREIGN PATENT DOCUMENTS

| | | |
|---|---|---|
| JP | 04-192543 | 7/1992 |
| JP | 2000-201066 | 7/2000 |
| JP | 3284995 | 7/2000 |
| JP | 2003-179484 | 6/2003 |
| JP | 2003-524969 | 8/2003 |
| JP | 2003-531509 | 10/2003 |

* cited by examiner

Primary Examiner—Anh Q Tran
(74) Attorney, Agent, or Firm—Foley & Lardner LLP

(57) ABSTRACT

A programmable semiconductor device of the invention includes: processing element unit executing a predetermined operation; input/output connection unit acting as a signal input part and/or a signal output part in processing element unit; interconnecting unit, comprised of a plurality of wires, connecting processing element unit via input/output connection unit; bidirectional repeater unit, arranged between the intersection points of interconnecting unit, performing disconnection, or driving interconnecting unit in the forward direction or in the reverse direction; and interconnection connecting unit, arranged at the intersection point, connecting interconnecting unit at the intersection point.

41 Claims, 10 Drawing Sheets

US 7,446,562 B2

PROGRAMMABLE SEMICONDUCTOR DEVICE

TECHNICAL FIELD

The present invention relates to a programmable semiconductor device capable of modifying the function of an processing element unit performing a predetermined operation and the connection between the processing element units, and more particularly to a programmable semiconductor device for dynamically reconfiguring the connection between processing element units by use of a small number of transistor elements and a small number of control lines when the size of the processing element units is large.

BACKGROUND ART

In recent years, with advancement of semiconductor technology, programmable semiconductor devices as typified by FPGA (Field Programmable Gate Array) allowing the user to implement a desired function in a programmable manner in a short period have come into wide use.

As another type of programmable semiconductor device, there has also been proposed DRP (Dynamically Reconfigurable Processor) capable of dynamic reconfiguring the processing element units by improving their performance from gate level to processor level.

Under such circumstances, with the recent advancement of miniaturization technology, it has become possible to enlarge functions installed per one chip in a semiconductor device. However, accompanying an enlargement in functions, there may be deterioration in the delay and reliability in the interconnecting unit that connects the processing element units, thus causing a problem. Thus, there has recently been proposed insertion of a repeater into the interconnecting unit.

For example, Japanese Patent Laid-Open No. 2000-201066 (hereinafter referred to as Patent Document 1) proposes a programmable logic device having a bidirectional repeater arranged in an upper-level interconnecting resource thereof (refer to pp. 4-5, FIG. 2 of Patent Document 1).

More specifically, the programmable logic device disclosed in Patent Document 1, as shown in FIG. 1, includes processing element unit (PE) 1, input/output connection unit 2, interconnecting unit 3 connecting processing element unit (PE) via input/output connection unit 2, bidirectional repeater unit 4 arranged between the intersection points of interconnecting units 3, and selector 8 for changing the connection between processing element units (PE) 1. In the programmable logic device, direction control information for controlling bidirectional repeater unit 4 is preliminarily held in the memory element and based on direction control information, bidirectional repeater unit 4 is controlled to perform disconnection, or to drive interconnecting unit 3 in the forward direction or in the reverse direction.

Also, Japanese Patent No. 3284995 (hereinafter referred to as Patent Document 2) discloses a bidirectional bus repeater control device (refer to FIG. 1 of Patent Document 2) to control a bidirectional repeater using logical sum (OR) of bus driver control signals, and a bidirectional bus repeater control device (refer to FIG. 10 of Patent Document 2) having added thereto a logical product (AND) block to halt transmission of a bidirectional repeater control signal to the bidirectional repeater, and a bidirectional bus repeater control device (refer to FIGS. 19 and 21 of Patent Document 2) to control the bidirectional repeater by use of a cooperation dynamic buffer.

However, with respect to the programmable logic device disclosed in Patent Document 1, a bidirectional repeater and a control circuit (memory element and control wire) used for such a bidirectional repeater are required; thus the circuit area increases, causing a problem. More specifically, control wires and memory elements of a number corresponding to the number of circuit configuration patterns and bidirectional repeaters are needed.

Also, with respect to the bidirectional bus repeater control device disclosed in Patent Document 2, no technique for applying such bidirectional bus repeater control device to a programmable semiconductor device has been disclosed. Accordingly, it seems difficult to apply the bidirectional bus repeater control device to a programmable semiconductor device.

DISCLOSURE OF THE INVENTION

An object of the present invention is to provide a programmable semiconductor device capable of suppressing an increase of the circuit area when a repeater is inserted into an interconnecting unit that interconnects processing elements.

The programmable semiconductor device according to the present invention is characterized by including: processing element means for executing a predetermined operation; input/output connection means acting as a signal input part and/or a signal output part in the processing element means; interconnection means comprised of a plurality of wires for connecting the processing element means via the input/output connection means; bidirectional repeater means arranged between intersection points of the interconnection means, for performing disconnection, or driving the interconnection means in the forward direction or in the reverse direction; and interconnection connecting means arranged at the intersection point of the interconnection means, for connecting the interconnection means at the intersection point.

More specifically, the bidirectional repeater means includes: bidirectional repeater drive means capable of being driven in a forward or reverse direction; and bidirectional repeater control means for controlling the bidirectional repeater drive means to perform an OFF operation, or to drive the bidirectional repeater drive means in the forward direction or in the reverse direction. Also, the bidirectional repeater control means includes: bidirectional repeater switching control means for outputting a bidirectional repeater switching control signal for performing ON/OFF control of the bidirectional repeater drive means; and bidirectional repeater direction control means for receiving the bidirectional repeater switching control signal from the bidirectional repeater switching control means and at the same time, for receiving an output enable signal from the processing element means and outputting to the bidirectional repeater drive means a bidirectional repeater control signal for controlling the bidirectional repeater drive means to perform an OFF operation, or to drive the bidirectional repeater drive means in the forward direction or in the reverse direction.

As such, according to the present invention, connection between processing element means can be implemented only by controlling the bidirectional repeater means. Accordingly, in contrast to the conventional case where the selector for changing the connection between processing element means and the repeater for driving signal lines are separately applied, the selector is not required and the number of memory elements, transistors, and control lines can be reduced; consequently, repeater function and programmable function can be implemented in a small area.

Also, according to the present invention, in the bidirectional repeater direction control means of the bidirectional repeater means, direction control of the interconnection means, i.e., direction control of the bidirectional repeater can be automated based on an output enable signal from the processing element means and a bidirectional repeater switching control signal from the bidirectional repeater switching control means. Therefore, direction control information for bidirectional repeater control as used in conventional art is not required; the number of memory elements and control lines can be reduced accordingly, allowing implementation of the bidirectional repeater control function in a small area.

BEST MODE FOR CARRYING OUT THE INVENTION

First Embodiment

Figure 1:
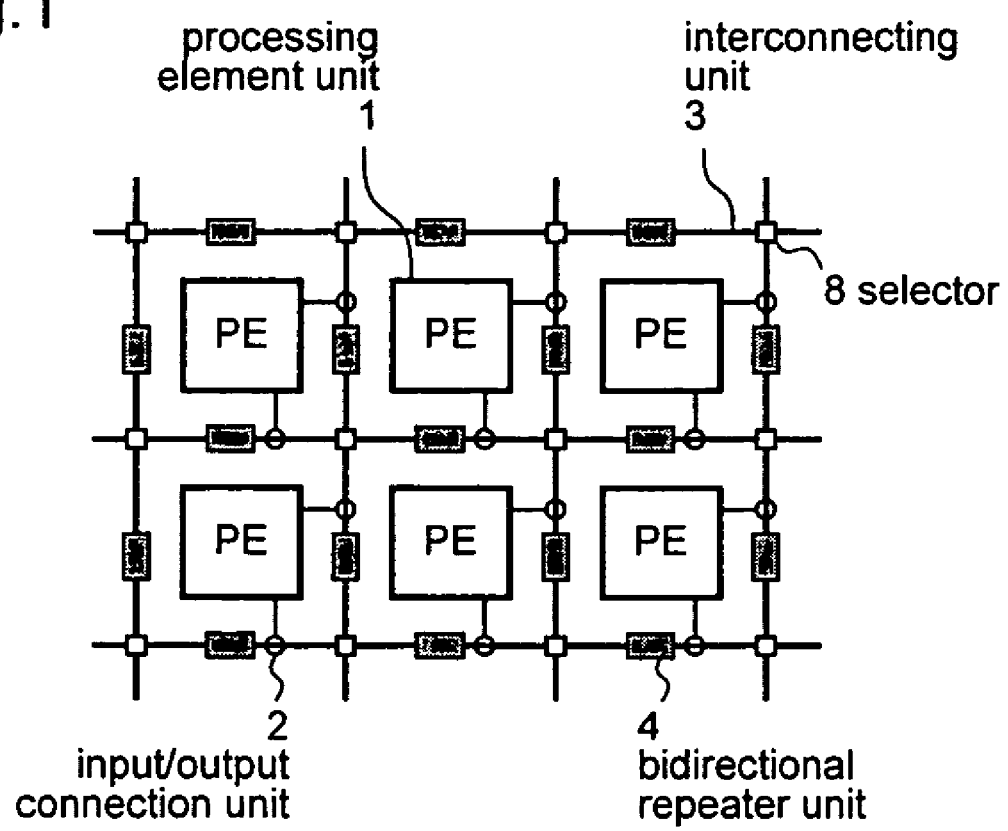
FIG. 1 is a block diagram illustrating an overall configuration of a conventional programmable semiconductor device shown in Patent Document 1.
Figure 2:
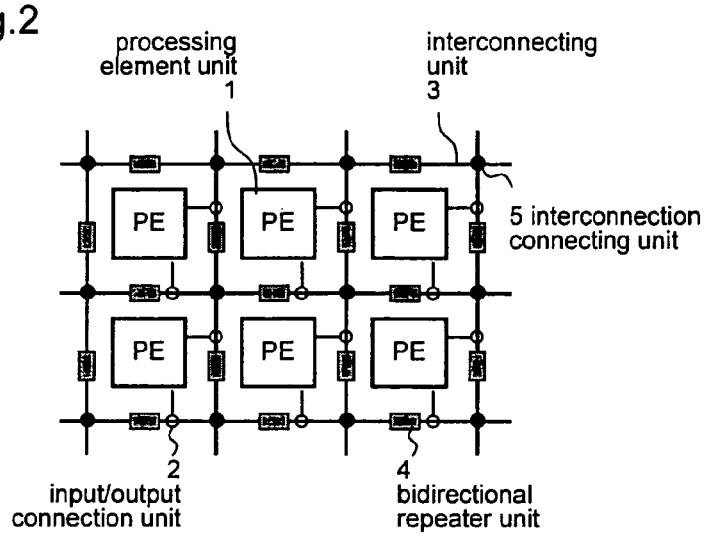
FIG. 2 is a block diagram illustrating an overall configuration of a programmable semiconductor device according to a first embodiment of the present invention.

FIG. 2 is a block diagram illustrating an overall configuration of a programmable semiconductor device according to a first embodiment of the present invention.

As shown in FIG. 2, the programmable semiconductor device according to the present embodiment includes: processing element unit (PE) 1 executing a predetermined operation according to an input control signal; input/output connection unit 2 acting as a signal input part and/or a signal output part in processing element unit (PE) 1; interconnecting unit 3 comprised of a plurality of wires in vertical and horizontal directions for connecting processing element unit (PE) 1 via input/output connection unit 2; bidirectional repeater unit 4, arranged between the intersection points of interconnecting unit 3, performing disconnection, or driving interconnecting unit 3 in the forward direction or in the reverse direction; and interconnection connecting unit 5, arranged at the intersection point of interconnecting unit 3, to act as wire connection connecting interconnecting unit 3 at the intersection point. In the programmable semiconductor device, these constituent components implement a communication network for a desired function.

Figure 3:
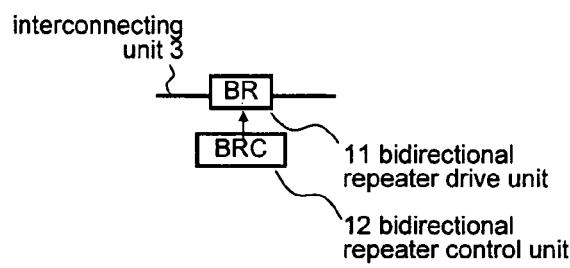
FIG. 3 is a block diagram illustrating a configuration of bidirectional repeater unit 4 in the programmable semiconductor device according to the first embodiment of the present invention.

Bidirectional repeater unit 4, as shown in FIG. 3, includes: bidirectional repeater drive unit (BR) 11 capable of being driven in a forward or reverse direction; and bidirectional repeater control unit (BRC) 12 for controlling bidirectional repeater drive unit (BR) 11 to perform an OFF operation, or to drive bidirectional repeater drive unit (BR) 11 in the forward direction or in the reverse direction.

Figure 4:
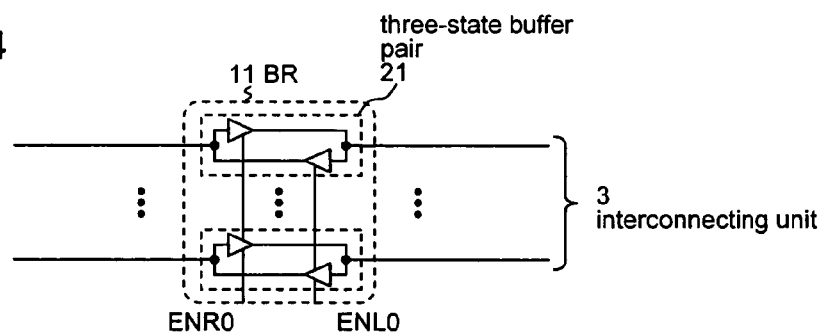
FIG. 4 is a block diagram illustrating a configuration of bidirectional repeater drive unit 11 in the programmable semiconductor device according to the first embodiment of the present invention.

Bidirectional repeater drive unit (BR) 11, as shown in FIG. 4, includes a three-state buffer pair 21.

Figure 5:
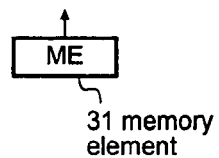
FIG. 5 is a block diagram illustrating a configuration of bidirectional repeater control unit 12 in the programmable semiconductor device according to the first embodiment of the present invention.
Figure 6:
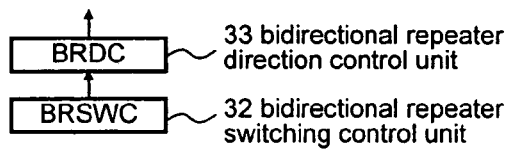
FIG. 6 is a block diagram illustrating another configuration of bidirectional repeater control unit 12 in the programmable semiconductor device according to the first embodiment of the present invention.

Bidirectional repeater control unit (BRC) 12, as shown in FIG. 5, includes memory element 31 having stored therein information on the configuration of the programmable semiconductor device. Alternatively, bidirectional repeater control unit (BRC) 12, as shown in FIG. 6, includes: bidirectional repeater switching control unit (BRSWC) 32 that outputs a bidirectional repeater switching control signal for performing ON/OFF control of bidirectional repeater drive unit (BR) 11; and bidirectional repeater direction control unit (BRDC) 33 that receives the bidirectional repeater switching control signal from bidirectional repeater switching control unit (BRSWC) 32 and, at the same time, receives an output enable signal from processing element unit (PE) and outputs to bidirectional repeater drive unit (BR) 11 a bidirectional repeater control signal for controlling bidirectional repeater drive unit (BR) 11 to perform an OFF operation, or to drive bidirectional repeater drive unit (BR) 11 in the forward direction or in the reverse direction. It is also possible that part of bidirectional repeater control unit (BRC) 12 includes bidirectional repeater direction control unit (BRDC) 33 and bidirectional repeater switching control unit (BRSWC) 32 and the rest of bidirectional repeater control unit (BRC) 12 includes only bidirectional repeater direction control unit (BRDC) 33.

Bidirectional repeater switching control unit (BRSWC) 32 includes memory element 31 as shown in FIG. 5. Alternatively, bidirectional repeater switching control unit (BRSWC) 32 includes an ordinary arbiter circuit.

A configuration of a base unit of the programmable semiconductor device when bidirectional repeater control unit (BRC) 12, as shown in FIG. 6, includes bidirectional repeater switching control unit (BRSWC) 32 and bidirectional repeater direction control unit (BRDC) 33, will now be described in detail with reference to FIG. 7.

Figure 7:
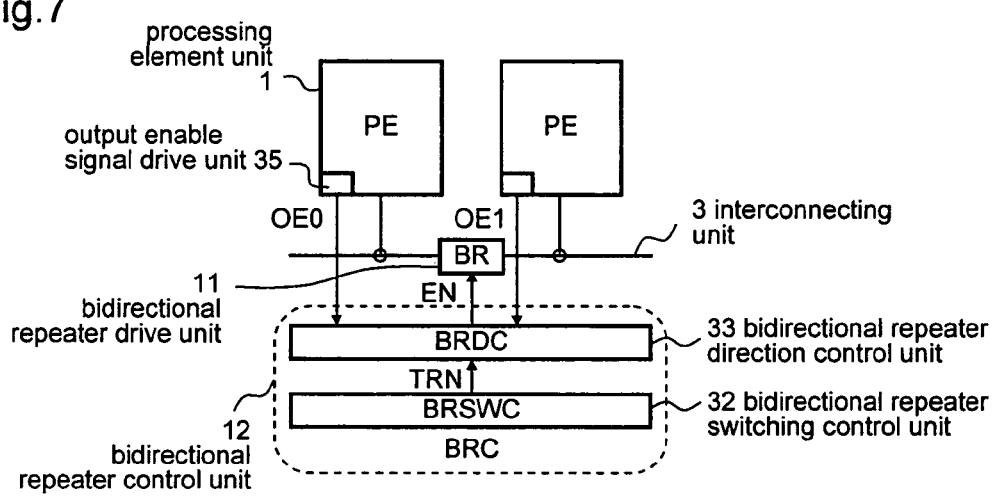
FIG. 7 is a block diagram illustrating a configuration of a base unit of the programmable semiconductor device according to the first embodiment of the present invention.

As shown in FIG. 7, bidirectional repeater direction control unit (BRDC) 33 receives bidirectional repeater switching control signal (TRN) outputted from bidirectional repeater switching control unit (BRSWC) 32 and also receives output enable signals OE0 and OE1, outputted from output enable signal drive unit 35 of processing element unit (PE) 1, and outputs bidirectional repeater control signal EN to bidirectional repeater drive unit (BR) 11 to control bidirectional repeater drive unit (BR) 11 to perform an OFF operation, or to drive bidirectional repeater drive unit (BR) 11 in the forward direction or in the reverse direction.

In bidirectional repeater unit 4 disposed in interconnecting unit 3 arranged in a horizontal direction, bidirectional repeater control signal EN is comprised of two signals, i.e., bidirectional repeater control signals ENR and ENL. In this case, bidirectional repeater direction control unit (BRDC) 33 changes bidirectional repeater control signal ENR to "1" and ENL to "0", for example when bidirectional repeater drive unit (BR) 11 is driven from the left to right direction, while changing bidirectional repeater control signal ENR to "0" and ENL to "1" when bidirectional repeater drive unit (BR) 11 is driven from the right to left direction. Also, in bidirectional repeater unit 4 disposed in interconnecting unit 3 arranged in a vertical direction, bidirectional repeater control signal EN is comprised of two signals, i.e., bidirectional repeater control signals ENU and END.

Figure 8:
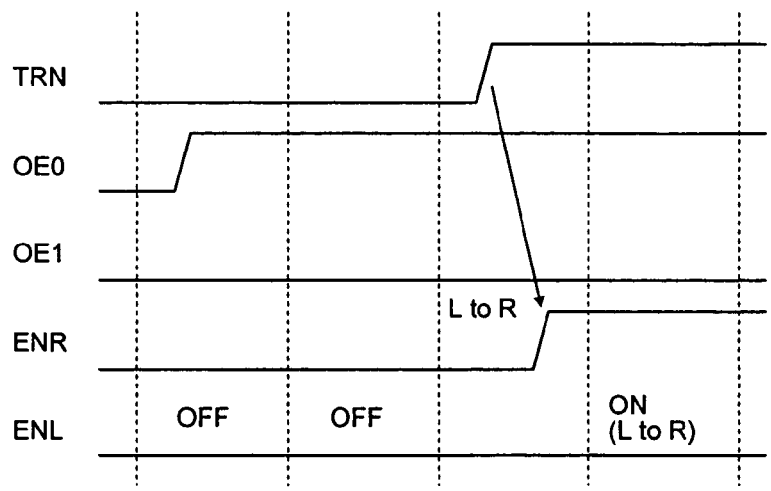
FIG. 8 is a timing chart for explaining the operation of the base unit of the programmable semiconductor device according to the first embodiment of the present invention.

The operation of the base unit of the programmable semiconductor device will now be described with reference to the timing chart of FIG. 8. FIG. 8 illustrates the relationship between bidirectional repeater switching control signal TRN outputted from bidirectional repeater switching control unit (BRSWC) 32, output enable signals OE0 and OE1 outputted from processing element unit (PE) 1 and bidirectional repeater control signals ENR and ENL outputted from bidirectional repeater direction control unit (BRDC) 33.

As shown in FIG. 8, when bidirectional repeater switching control signal TRN is "0", bidirectional repeater control signals ENR and ENL are changed to "0" to turn off bidirectional repeater drive unit (BR) 11. At the time when bidirectional repeater switching control signal TRN is changed to "1", output enable signal OE0 is "1" and OE1 is "0", and there is an output from the left side processing element unit (PE) 1. Thus, in order to drive bidirectional repeater drive unit (BR) 11 from the left to right direction, bidirectional repeater control signal ENR is changed to "1" and ENL to "0".

Second Embodiment

Figure 9:
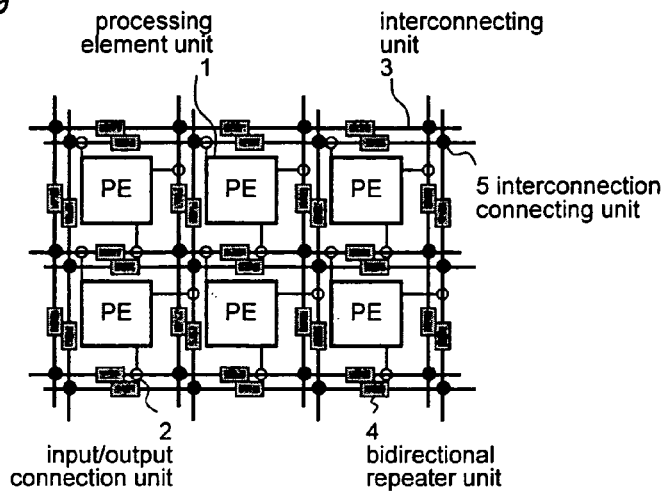
FIG. 9 is a block diagram illustrating an overall configuration of a programmable semiconductor device according to a second embodiment of the present invention.

FIG. 9 is a block diagram illustrating an overall configuration of a programmable semiconductor device according to a second embodiment of the present invention.

In the first embodiment described above, one channel of interconnecting unit 3 is provided and at the same time, two sets of input/output connection units 2 connectable to the one channel of interconnecting unit 3 are provided. In contrast, according to the present embodiment, as shown in FIG. 9, two channels of interconnecting units 3 are provided and at the same time, three sets of input/output connection units 2 connectable to the two channels of interconnecting units 3 are provided. The number of channels of interconnecting unit 3 and the number of sets of input/output connection unit 2 are to be provided as required to implement desired functions; there is no particular limitation. However, the numbers are preferably small to reduce the area. Similarly, the number of bits represented by one channel of interconnecting unit 3 is not limited.

Third Embodiment

Figure 10:
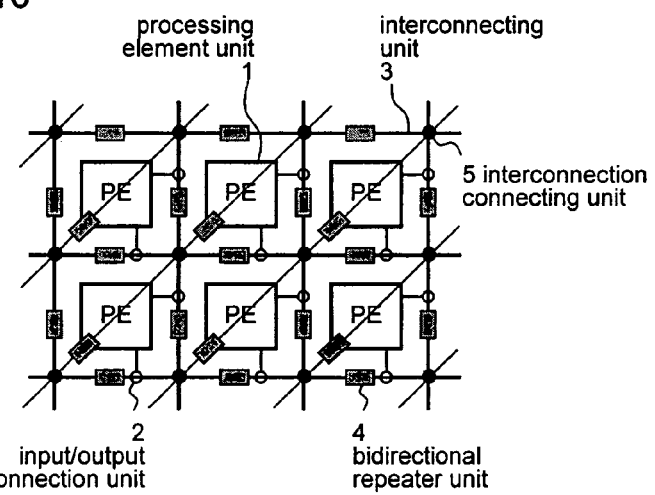
FIG. 10 is a block diagram illustrating an overall configuration of a programmable semiconductor device according to a third embodiment of the present invention.

FIG. 10 is a block diagram illustrating an overall configuration of a programmable semiconductor device according to a third embodiment of the present invention.

In the first embodiment described above, interconnecting unit 3 is arranged in vertical and horizontal directions. In contrast, according to the present embodiment, as shown in FIG. 10, interconnecting unit 3 is additionally arranged in an oblique direction. It is also possible that interconnecting unit 3 is further arranged in another oblique direction.

Fourth Embodiment

Figure 11:
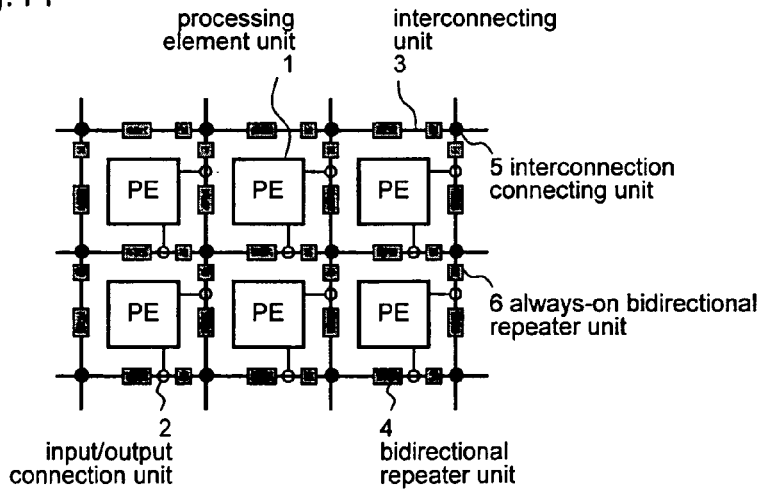
FIG. 11 is a block diagram illustrating an overall configuration of a programmable semiconductor device according to a fourth embodiment of the present invention.

FIG. 11 is a block diagram illustrating an overall configuration of a programmable semiconductor device according to a fourth embodiment of the present invention.

In the first embodiment described above, between the intersection points of interconnecting unit 3, only bidirectional repeater unit 4 is arranged. In contrast, according to the present embodiment, as shown in FIG. 11, between intersection points of interconnecting unit 3, in addition to bidirectional repeater unit 4, always-on bidirectional repeater unit 6 is added. The location of placement of always-on bidirectional repeater unit 6 and the number of repeaters 6 are not particularly limited, but the number is preferably small to reduce the area.

Figure 12:
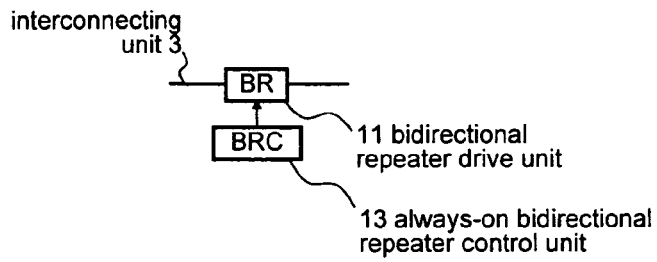
FIG. 12 is a block diagram illustrating a configuration of always-on bidirectional repeater unit 6 in the programmable semiconductor device according to the fourth embodiment of the present invention.

Always-on bidirectional repeater unit 6, as shown in FIG. 12, includes: bidirectional repeater drive unit (BR) 11; and always-on bidirectional repeater control unit (BRC) 13 for controlling bidirectional repeater drive unit (BR) 11 to perform an OFF operation, or to drive bidirectional repeater drive unit (BR) 11 in the forward direction or in the reverse direction.

Figure 13:
FIG. 13 is a block diagram illustrating a configuration of always-on bidirectional repeater control unit 13 in the programmable semiconductor device according to the fourth embodiment of the present invention.

Always-on bidirectional repeater control unit (BRC) 13 includes memory element 31 as shown in FIG. 5 having stored therein information on the configuration of the programmable semiconductor device. Also, always-on bidirectional repeater control unit (BRC) 13, as shown in FIG. 13, includes always-on bidirectional repeater direction control unit (BRDC) 34 for receiving an output enable signal from processing element unit (PE) and for outputting to bidirectional repeater drive unit (BR) 11 a bidirectional repeater control signal for controlling bidirectional repeater drive unit (BR) 11 to perform an OFF operation, or to drive bidirectional repeater drive unit (BR) 11 in the forward direction or in the reverse direction.

A configuration for implementing synchronization of bidirectional repeater unit 4 and always-on bidirectional repeater unit 6 will now be described with reference to FIG. 14.

Figure 14:
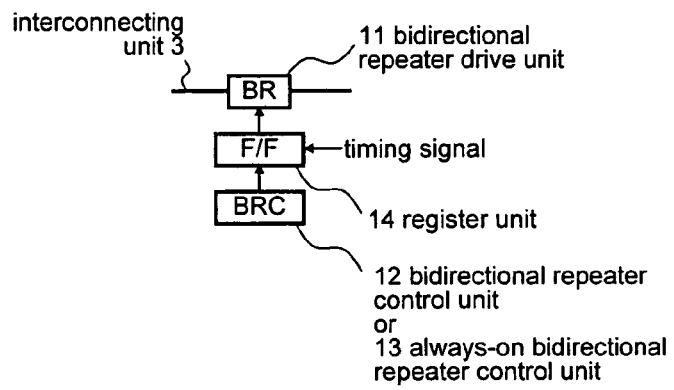
FIG. 14 is a block diagram illustrating a configuration for synchronization of bidirectional repeater unit 4 or always-on bidirectional repeater unit 6 in the programmable semiconductor device according to the first to fourth embodiments of the present invention.

As shown in FIG. 14, bidirectional repeater unit 4 has a configuration in which register unit 14 which is to receive a timing signal is inserted between bidirectional repeater drive unit (BR) 11 and bidirectional repeater control unit (BRC) 12 shown in FIG. 3. In this manner, in the output part of bidirectional repeater control unit (BRC) 12, there is inserted register unit 14, whereby the output of bidirectional repeater control unit (BRC) 12 is synchronized by a timing signal. Consequently, it is possible to prevent the output of the output buffer (not illustrated) in processing element unit (PE) 1 and the output of three-state buffer pair 21 in bidirectional repeater drive unit (BR) 11 from being shorted to each other, the short resulting in a bus fight. It is also possible to equal the output timing of signal from the output buffer of processing element unit (PE) 1.

In always-on bidirectional repeater unit 6, also, when register unit 14 is, as in FIG. 14, inserted between bidirectional repeater drive unit (BR) 11 and always-on bidirectional repeater control unit (BRC) 13, synchronization can be implemented.

The configuration and operation of the present invention will now be described with reference to illustrative examples.

EXAMPLE 1

Figure 15:
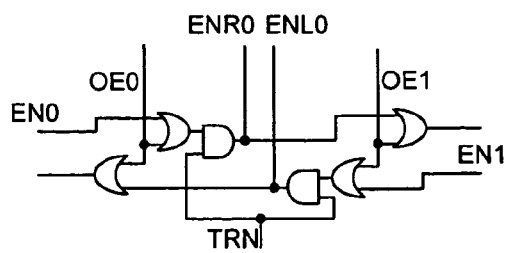
FIG. 15 is a block diagram illustrating a configuration of bidirectional repeater direction control unit 33 in a base unit of a programmable semiconductor device according to Example 1 of the present invention.

FIG. 15 is a circuit diagram illustrating a configuration of bidirectional repeater direction control unit (BRDC) 33 in a base unit of a programmable semiconductor device according to Example 1 of the present invention.

As shown in FIG. 15, bidirectional repeater direction control unit (BRDC) 33 includes: an OR gate calculating an OR of output enable signals OE0 and OE1 from processing element unit (PE) 1 and enable signals EN0 and EN1 from parts corresponding to the intersection points of interconnecting unit 3; an AND gate calculating an AND of the result of the above calculation and bidirectional repeater switching control signal TRN from bidirectional repeater switching control unit (BRSWC) 32 and then outputting such calculation result as bidirectional repeater control signals ENR0 and ENL0.

For example, when bidirectional repeater switching control signal TRN is "1", if left-side upstream enable signal EN0 is "1" or output enable signal OE0 is "1", then bidirectional repeater control signal ENR0 for driving bidirectional repeater drive unit (BR) 11 from left to right is changed to "1". Also, if right-side upstream enable signal EN1 is "1" or output enable signal OE1 is "1", then bidirectional repeater control signal ENL0 for driving bidirectional repeater drive unit (BR) 11 from right to left is changed to "1". When bidirectional repeater switching control signal TRN is "0", ENR0 and ENL0 are changed to "0" to turn off bidirectional repeater drive unit (BR) 11.

EXAMPLE 2

Figure 16:
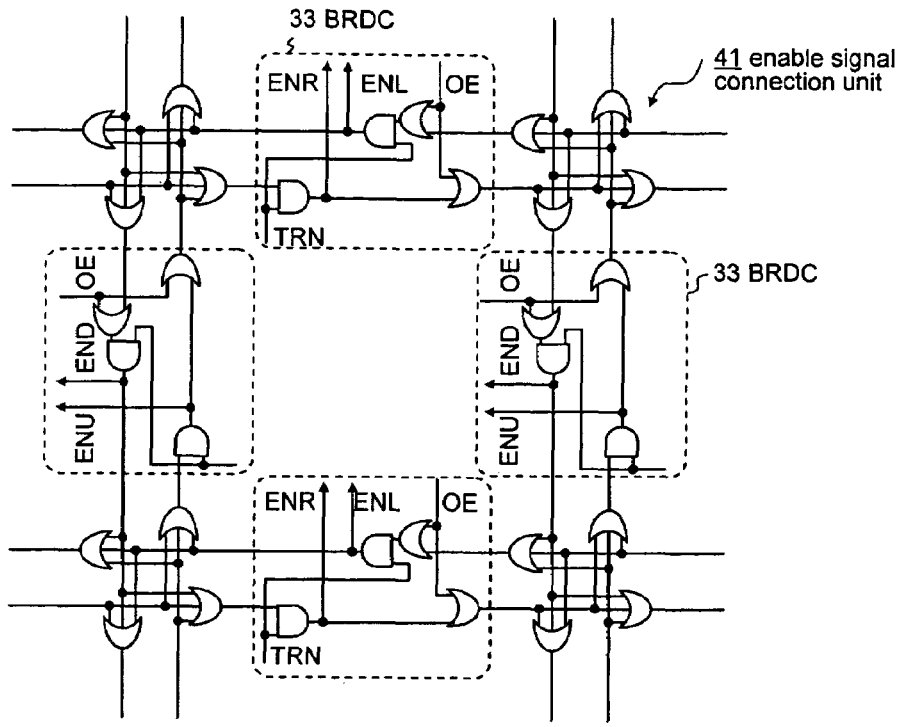
FIG. 16 is a circuit diagram illustrating a configuration of a base array unit of a programmable semiconductor device according to Example 2 of the present invention.

FIG. 16 is a circuit diagram illustrating a configuration of a base array unit of a programmable semiconductor device according to Example 2 of the present invention.

As shown in FIG. 16, a branching part of enable signal connection unit 41, arranged in parallel with interconnecting unit 3, is implemented by an OR gate. That is, when interconnecting unit 3 is branched at interconnection connecting unit 5, enable signal connection unit 41 is branched along with this. In bidirectional repeater direction control unit (BRDC) 33, as described above, an OR of output enable signal OE and an enable signal from enable signal connection unit 41 are calculated; an AND of the result of the above calculation and bidirectional repeater switching control signal TRN is calculated. As a result, bidirectional repeater control signals ENR, ENL, ENU and END are produced.

EXAMPLE 3

Figure 17:
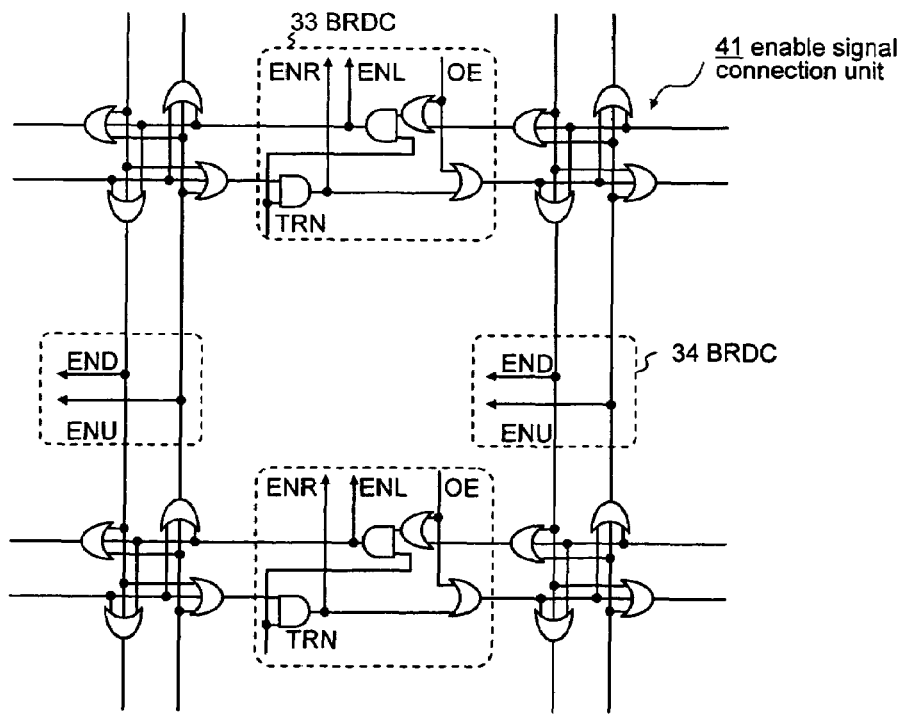
FIG. 17 is a circuit diagram illustrating a configuration of a base array unit of a programmable semiconductor device according to Example 3 of the present invention.

FIG. 17 is a circuit diagram illustrating a configuration of a base array unit of a programmable semiconductor device according to Example 3 of the present invention.

In Example 2 described above, bidirectional repeater unit 4 is arranged, in interconnecting unit 3 disposed in a vertical direction. In contrast, according to the present example, as shown in FIG. 17, instead of bidirectional repeater unit 4, always-on bidirectional repeater unit 6 is arranged in interconnecting unit 3 disposed in a vertical direction. Always-on bidirectional repeater 6 receives neither output enable signal OE from processing element unit (PE) 1 nor bidirectional repeater switching control signal TRN and does not therefore require the addition of a logical gate; an enable signal from enable signal connection unit 41 can be directly used as always-on bidirectional repeater control signals ENU and END. Also, in the configuration which adds always-on bidirectional repeater unit 6 to bidirectional repeater unit 4 to increase drive performance (refer to FIG. 11), the added always-on bidirectional repeater unit 6 also has a configuration similar to the one above described to perform similar control.

EXAMPLE 4

Figure 18:
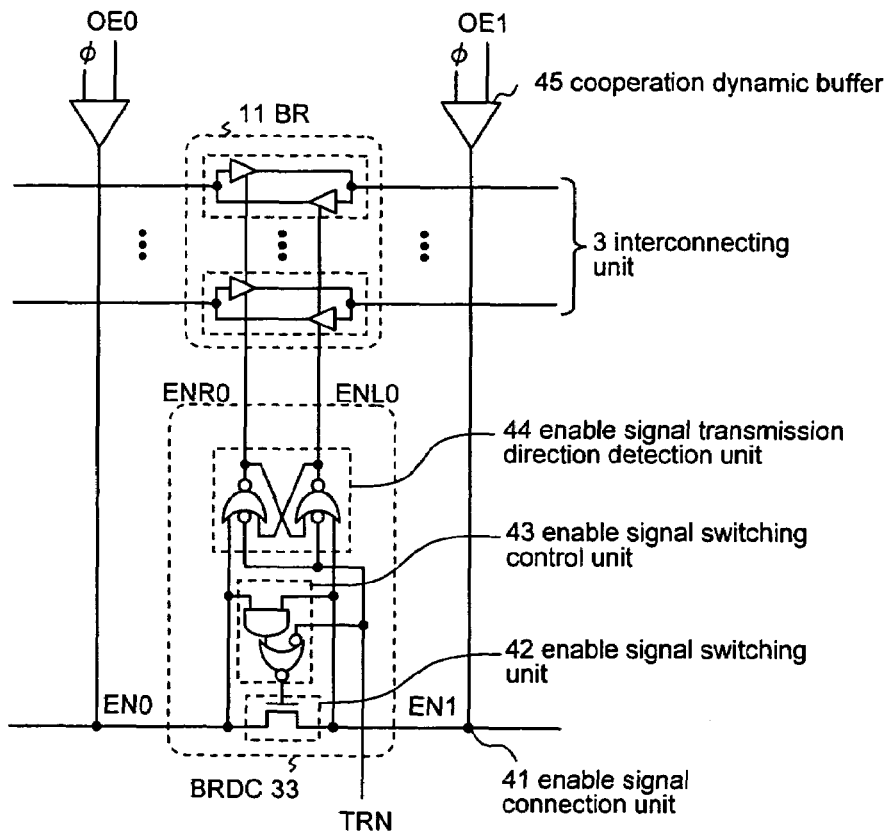
FIG. 18 is a circuit diagram illustrating a configuration of a base unit of a programmable semiconductor device according to Example 4 of the present invention.

FIG. 18 is a circuit diagram illustrating a configuration of a base unit of a programmable semiconductor device according to Example 4 of the present invention.

As shown in FIG. 18, bidirectional repeater direction control unit (BRDC) 33 includes: enable signal switching unit 42 connected to enable signal connection unit 41; enable signal switching control unit 43 to control enable signal switching unit 42; and enable signal transmission direction detection unit 44 to detect a transmission direction of enable signals EN0 and EN1 and to output the detection result as bidirectional repeater control signals ENR0 and ENL0.

Referring to FIG. 18, enable signal switching unit 42 includes an nMOS transistor. Enable signal switching control unit 43 includes: an AND gate to calculate an AND of enable signals EN0 and EN1 from enable signal connection units 41 disposed at both sides of enable signal switching unit 42; and a NOR gate to calculate a NOR of a result of the above calculation and an inversion signal of bidirectional repeater switching control signal TRN. Enable signal transmission direction detection unit 44 includes two NOR gates to receive enable signals EN0 and EN1 from enable signal connection units 41 disposed at both sides of enable signal switching unit 42, respectively and, at the same time, to invert and to receive bidirectional repeater switching control signal TRN and to receive each other's output as an input to the NOR gate of the other, enable signal transmission direction detection unit 44 being a NOR latch circuit to output, as bidirectional repeater control signals ENR0 and ENL0, NOR calculation results obtained by each of the two NOR gates.

Also, referring to FIG. 18, output enable signals OE0 and OE1 from processing element unit (PE) 1 are driven by cooperation dynamic buffer 45.

Cooperation dynamic buffer 45 receives timing signal φ and an output signal and output enable signal OE from processing element unit (PE) 1 and performs pre-charge or pre-discharge processing according to timing signal φ; in a period (corresponding to a configuration modifying period described later) where such processing is not performed, buffer outputting is performed according to output enable signal OE, and when output enable signal OE is inactive, buffer outputting is performed according to a change in the output signal. Cooperation dynamic buffer 45 can be implemented by a circuit configuration as shown in FIG. 19 or 20, for example.

Timing signal φ supplied to cooperation dynamic buffer 45 has a configuration fixing period (for example, a period being "0") and a configuration modifying period (for example, a period being "1"). When timing signal φ is in a configuration modifying period, output enable signal OE and bidirectional repeater switching control signal TRN are changed and when timing signal φ enters subsequently a configuration fixing period, the outputting of bidirectional repeater control signals ENR0 and ENL0 is determined.

Figure 21:
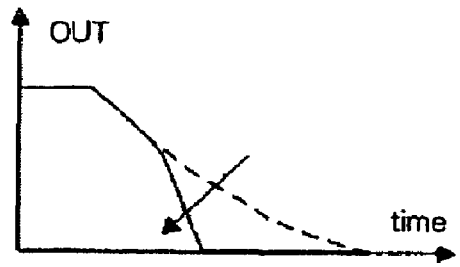
FIG. 21 is a waveform exhibiting a characteristic of cooperation dynamic buffer 45 in the programmable semiconductor device according to Example 4 of the present invention.

Circuit characteristics of cooperation dynamic buffer 45 will now be described with reference to FIGS. 19 and 21.

Figure 19:
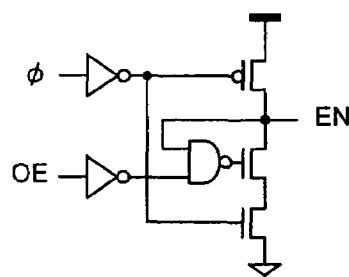
FIG. 19 is a circuit diagram illustrating a configuration of cooperation dynamic buffer 45 in the programmable semiconductor device according to Example 4 of the present invention.
Figure 20:
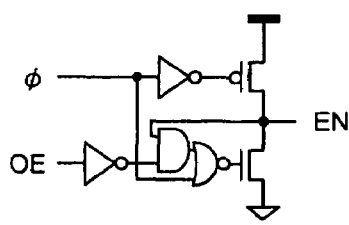
FIG. 20 is a circuit diagram illustrating another configuration of cooperation dynamic buffer 45 in the programmable semiconductor device according to Example 4 of the present invention.

Referring to FIG. 19, when a fall in the logical value of enable signal EN, which is an output signal, is detected by a negative AND gate, the logical value of the NAND gate is changed to "1" and thus an nMOS transistor connected to an output of the negative AND gate is turned on. Consequently, as shown in FIG. 21, even when output enable signal OE is "0", the logical value of enable signal EN will further fall in an accelerated manner, thus accelerating the change of enable signal EN.

Figure 22:
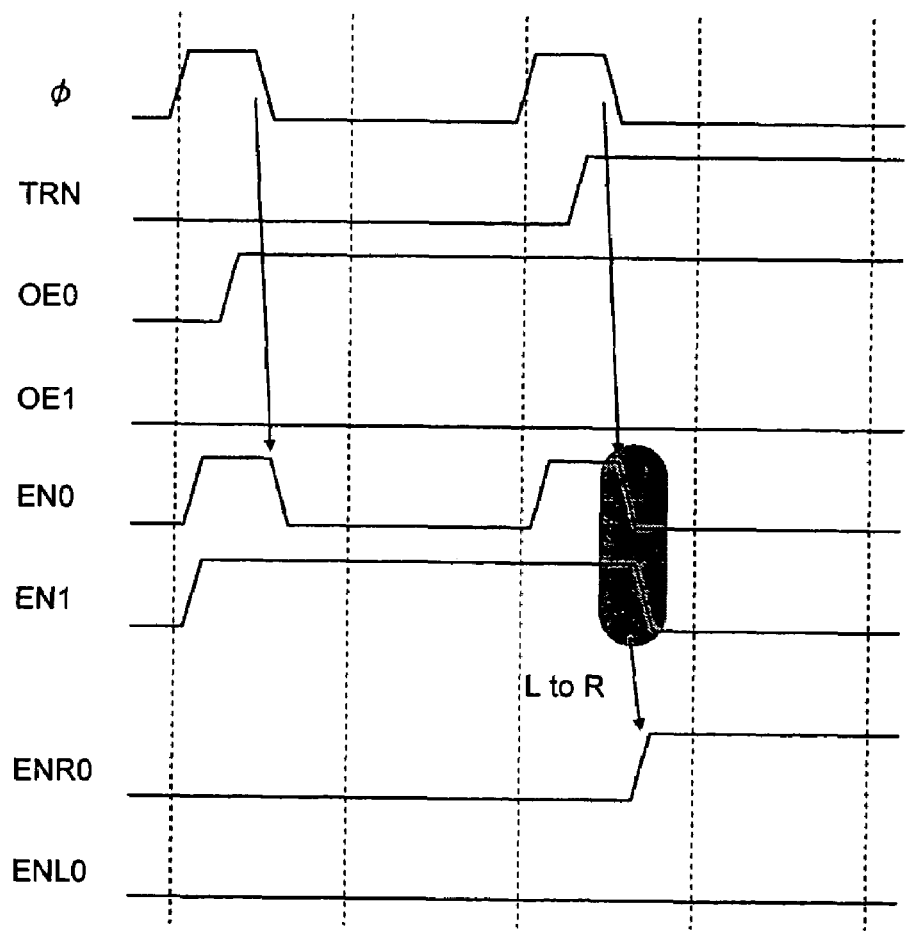
FIG. 22 is a timing chart for explaining the operation of the base unit of the programmable semiconductor device according to Example 4 of the present invention.

The operation of the base unit (the configuration of FIG. 18) of the programmable semiconductor device will now be described with reference to the timing chart of FIG. 22. FIG. 22 illustrates a relationship between timing signal φ, bidirectional repeater switching control signal TRN from bidirectional repeater switching control unit 32, output enable signals OE0 and OE1 from processing element unit (PE) 1, enable signal EN0 and EN1 from enable signal connection unit 41, and bidirectional repeater control signals ENR and ENL from bidirectional repeater direction control unit (BRDC) 33.

As shown in FIG. 22, when the connection between processing element units (PE) 1 is reconfigured, timing signal φ is changed to "1" to change enable signals EN0 and EN1 to "1". As a result, a control signal supplied to enable signal switching unit 42 is changed to "0". Consequently, enable signal switching unit 42 is turned off and, at the same time, bidirectional repeater control signals ENR and ENL outputted from enable signal transmission direction detection unit 44 are changed to "0" to turn off bidirectional repeater drive unit (BR) 11.

In this manner, in a period where timing signal φ is changed to "1", output enable signals OE0 and OE1 and bidirectional repeater switching control signal TRN are changed.

For example, in a period where timing signal φ is first changed to "1", when only output enable signal OE0 is changed to "1" and subsequently, when timing signal φ is changed to "0", then enable signal EN0 is changed to "0" in response to which that output enable signal OE0 is "1". However, at this time, bidirectional repeater switching control signal TRN is "0", so both enable signal switching unit 42 and bidirectional repeater drive unit (BR) 11 remains in an OFF state.

In a period where timing signal φ is subsequently changed to "1" when bidirectional repeater switching control signal TRN is changed to "1" followed by changing timing signal φ to "0", the change of enable signal EN0 to "0" is detected, and thus enable signal switching unit 42 is turned on and enable signal EN1 is changed to "0". As a result, the left-to-right direction of transmission of enable signal is detected, and thus bidirectional repeater control signal ENR0 is changed to "1" to activate a path from left to right and then bidirectional repeater drive unit (BR) 11 is turned on. In this manner, bidirectional repeater drive unit (BR) 11 is once changed to an OFF state, so no bus fight occurs on interconnecting unit 3, thus making it possible to omit register unit 14 (refer to FIG. 14) used as a bus fight countermeasure.

EXAMPLE 5

Figure 23:
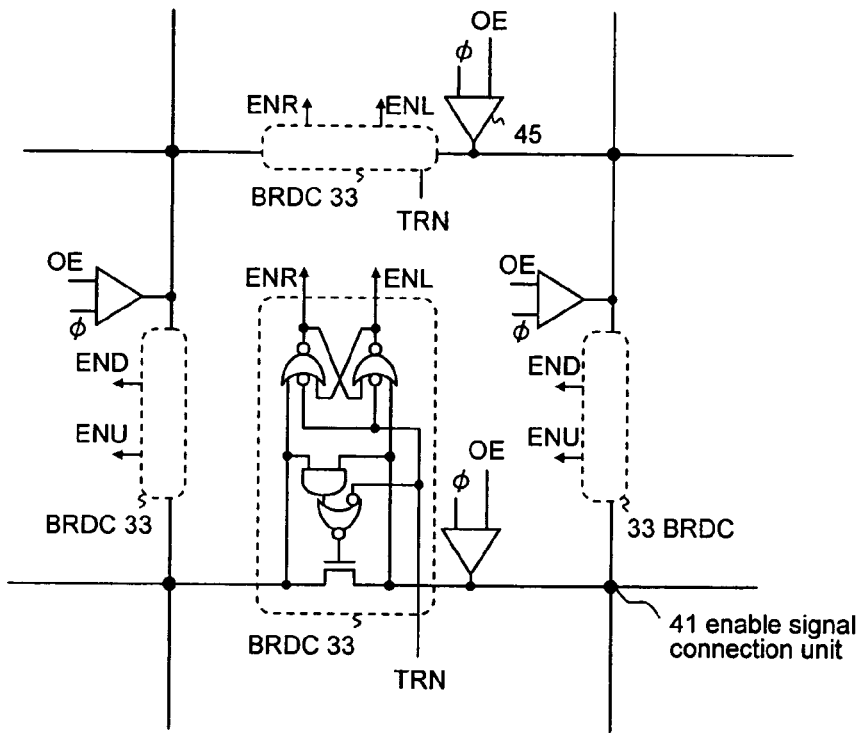
FIG. 23 is a circuit diagram illustrating a configuration of a base array unit of a programmable semiconductor device according to Example 5 of the present invention.

FIG. 23 is a circuit diagram illustrating a configuration of a base array unit of a programmable semiconductor device according to Example 5 of the present invention.

In Example 2 described above, the branching part of enable signal connection unit 41 arranged in parallel with interconnecting unit 3 is implemented by an OR gate. In contrast, according to the present example, as shown in FIG. 23, the branching part of enable signal connection unit 41 is implemented by a wire connection. Output enable signal OE is driven by cooperation dynamic buffer 45; cooperation dynamic buffer 45 is connected to enable signal connection unit 41. As in Example 4, bidirectional repeater direction control unit (BRDC) 33 is connected to enable signal connection unit 41.

EXAMPLE 6

Figure 24:
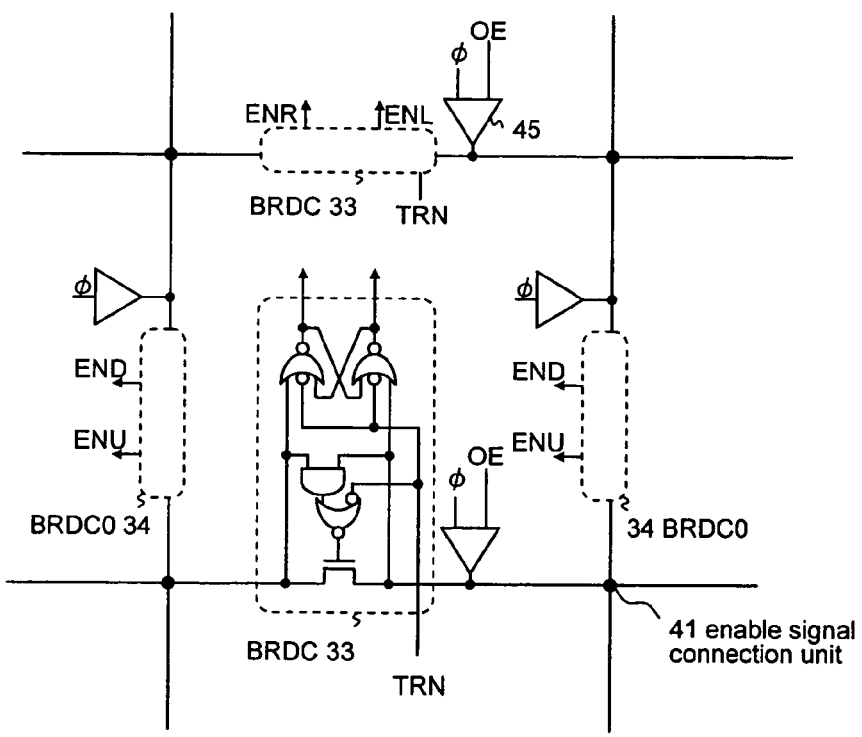
FIG. 24 is a circuit diagram illustrating a configuration of a base array unit of a programmable semiconductor device according to Example 6 of the present invention.

FIG. 24 is a circuit diagram illustrating the configuration of a base array unit of a programmable semiconductor device according to Example 6 of the present invention.

In Example 5 described above, bidirectional repeater unit 4 is arranged, in interconnecting unit 3 disposed in a vertical direction. In contrast, according to the present example, as shown in FIG. 24, instead of bidirectional repeater unit 4, always-on bidirectional repeater unit 6 is arranged, in interconnecting unit 3 disposed in a vertical direction.

Always-on bidirectional repeater 6 receives neither output enable signal OE from processing element unit (PE) 1 nor bidirectional repeater switching control signal TRN.

Figure 25:
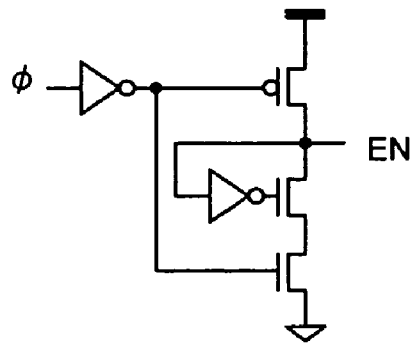
FIG. 25 is a circuit diagram illustrating a configuration of cooperation dynamic buffer 45 in the programmable semiconductor device according to Example 6 of the present invention.
Figure 26:
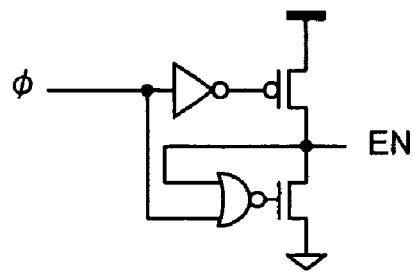
FIG. 26 is a circuit diagram illustrating another configuration of cooperation dynamic buffer 45 in the programmable semiconductor device according to Example 6 of the present invention.

Therefore, cooperation dynamic buffer 45 can be implemented by a circuit configuration as shown in FIG. 25 or 26.

Figure 27:
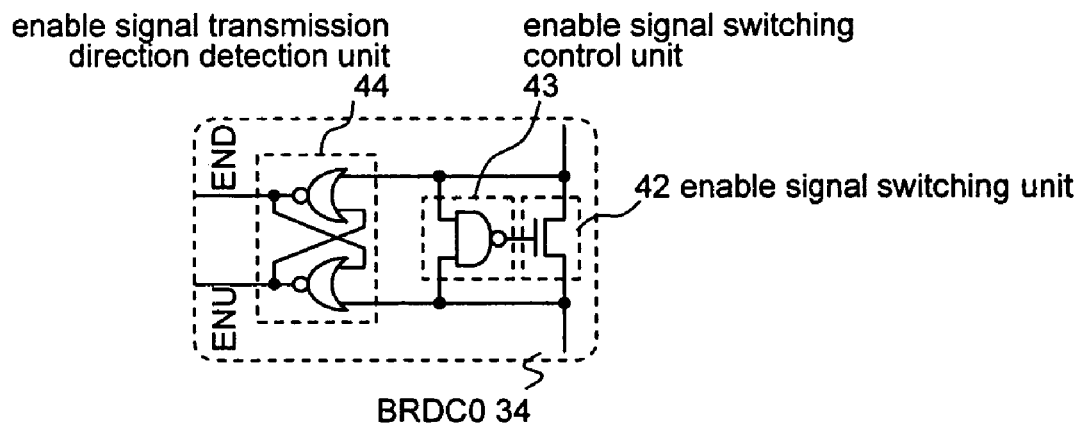
FIG. 27 is a circuit diagram illustrating a configuration of always-on bidirectional repeater direction control unit 34 in the programmable semiconductor device according to Example 6 of the present invention.

Also, always-on bidirectional repeater direction control unit (BRDC) 34 can be implemented by a circuit configuration as shown in FIG. 27, for example.

Referring to FIG. 27, enable signal switching unit 42 includes an nMOS transistor; enable signal switching control unit 43 includes a NAND gate to calculate an NAND of enable signals EN0 and EN1 from enable signal connection units 41 disposed at both sides of enable signal switching unit 42; enable signal transmission direction detection unit 44 includes two NOR gates to receive enable signals EN0 and EN1 from enable signal connection units 41 disposed at both sides of enable signal switching unit 42, respectively and to receive each other's output as an input to the NOR gate of the other, enable signal transmission direction detection unit 44 being a NOR latch circuit to output, as bidirectional repeater control signals ENU and END, the NOR calculation results obtained by each of the two NOR gates.

Also, in the configuration which adds always-on bidirectional repeater unit 6 to bidirectional repeater unit 4 to increase drive performance (refer to FIG. 11), added always-on bidirectional repeater unit 6 also has a configuration similar to the one above described to perform similar control.

As an example of applying the programmable semiconductor device of the present invention, Dynamic Reconfigurable Processor (DRP) and the like can be listed. DRP includes a processing element (processing element unit) having a base unit of several bits and a programmable wire; functions required by the user are implemented by dynamically modifying the processing element unit and the configuration of the communication network. In case of DRP, the scale of the processing element unit is large, so a repeater must be inserted for each processing element unit. It is thus essential to optimize the communication network under the assumption that repeaters will be inserted.

The invention claimed is:

1. A programmable semiconductor device comprising:
   processing element means for executing a predetermined operation;
   input/output connection means acting as a signal input part and/or a signal output part in the processing element means;
   interconnection means comprised of a plurality of wires for connecting the processing element means via the input/output connection means;
   bidirectional repeater means arranged between intersection points of the interconnection means, for dynamically performing disconnection, or dynamically driving the interconnection means in the forward direction or in the reverse direction; and
   interconnection connecting means arranged at the intersection point of the interconnection means, for connecting the interconnection means at the intersection point.

2. The programmable semiconductor device according to claim 1, wherein the interconnection means is comprised of wires in vertical and horizontal directions.

3. The programmable semiconductor device according to claim 1, wherein the interconnection means is comprised of wires in vertical, horizontal and oblique directions.

4. The programmable semiconductor device according to claim 1, wherein a plurality of channels of the interconnection means are provided.

5. The programmable semiconductor device according to claim 1, wherein the input/output connection means can be arbitrarily connected to any of the plurality of channels of the interconnection means.

6. The programmable semiconductor device according to claim 1, wherein the interconnection connecting means is a wire connection.

7. The programmable semiconductor device according to claim 1, wherein the bidirectional repeater means includes:
   bidirectional repeater drive means capable of being driven in a forward or reverse direction; and
   bidirectional repeater control means for controlling the bidirectional repeater drive means to perform an OFF operation, or to drive the bidirectional repeater drive means in the forward direction or in the reverse direction.

8. The programmable semiconductor device according to claim 7, wherein the bidirectional repeater drive means includes a three-state buffer pair.

9. The programmable semiconductor device according to claim 7, wherein the bidirectional repeater control means includes a memory element having stored therein information on configuration of the programmable semiconductor device.

10. A programmable semiconductor device comprising:
    processing element means for executing a predetermined operation;
    input/output connection means acting as a signal input part and/or a signal output part in the processing element means;
    interconnection means comprised of a plurality of wires for connecting the processing element means via the input/output connection means;
    bidirectional repeater means arranged between intersection points of the interconnection means, for performing disconnection, or driving the interconnection means in the forward direction or in the reverse direction; and
    interconnection connecting means arranged at the intersection point of the interconnection means, for connecting the interconnection means at the intersection point;
    wherein the bidirectional repeater means includes:
    bidirectional repeater drive means capable of being driven in a forward or reverse direction;
    bidirectional repeater control means for controlling the bidirectional repeater drive means to perform an OFF operation, or to drive the bidirectional repeater drive means in the forward direction or in the reverse direction; and
    wherein the bidirectional repeater control means includes:
    bidirectional repeater switching control means for outputting a bidirectional repeater switching control signal for performing ON/OFF control of the bidirectional repeater drive means; and
    bidirectional repeater direction control means for receiving the bidirectional repeater switching control signal from the bidirectional repeater switching control means and, at the same time, for receiving an output enable signal from the processing element means and outputting to the bidirectional repeater drive means a bidirectional repeater control signal for controlling the bidirectional repeater drive means to perform an OFF operation, or to drive the bidirectional repeater drive means in the forward direction or in the reverse direction.

11. The programmable semiconductor device according to claim 10, wherein the bidirectional repeater switching control means includes a memory element having stored therein information on configuration of the programmable semiconductor device.

12. A programmable semiconductor device comprising:
    processing element means for executing a predetermined operation;

input/output connection means acting as a signal input part and/or a signal output part in the processing element means;

interconnection means comprised of a plurality of wires for connecting the processing element means via the input/output connection means;

bidirectional repeater means arranged between intersection points of the interconnection means, for performing disconnection, or driving the interconnection means in the forward direction or in the reverse direction; and interconnection connecting means arranged at the intersection point of the interconnection means, for connecting the interconnection means at the intersection point;

wherein the bidirectional repeater means comprises:

bidirectional repeater drive means capable of being driven in a forward or reverse direction;

bidirectional repeater control means for controlling the bidirectional repeater drive means to perform an OFF operation, or to drive the bidirectional repeater drive means in the forward direction or in the reverse direction; and wherein the bidirectional repeater control means has a configuration which synchronizes an output of the bidirectional repeater control means by use of a timing signal.

13. The programmable semiconductor device according to claim 10, wherein the bidirectional repeater direction control means includes:

an OR gate for calculating an OR of an output enable signal from the processing element means and an enable signal from enable signal connection means arranged in parallel with the interconnection means; and an AND gate for calculating an AND of a calculation result obtained by the OR gate and the bidirectional repeater switching control signal from the bidirectional repeater switching control means and then outputting the calculation result as the bidirectional repeater control signal.

14. The programmable semiconductor device according to claim 10, wherein the bidirectional repeater direction control means includes:

enable signal switching means connected to enable signal connection means arranged in parallel with the interconnection means;

enable signal switching control means for controlling the enable signal switching means; and enable signal transmission direction detection means for detecting the direction of transmission of the enable signal from the enable signal connection means and outputting the detection result as the bidirectional repeater control signal.

15. The programmable semiconductor device according to claim 14, wherein:

the enable signal switching means includes an nMOS transistor;

the enable signal switching control means includes: an AND gate for calculating an AND of enable signals from the enable signal connection means disposed at both sides of the enable signal switching means; and a NOR gate for calculating a NOR of a calculation result obtained by the AND gate and an inversion signal of the bidirectional repeater switching control signal from the bidirectional repeater switching control means; and the enable signal transmission direction detection means includes two NOR gates for receiving the enable signal from the enable signal connection means disposed at both sides of the enable signal switching means, respectively and at the same time, for inverting and receiving the bidirectional repeater switching control signal and receiving each other's output as an input to the NOR gate of the other, the enable signal transmission direction detection means being a NOR latch circuit for outputting, as the bidirectional repeater control signal, a NOR calculation result obtained by each of the two NOR gates.

16. The programmable semiconductor device according to claim 14, wherein:

the enable signal switching means includes an nMOS transistor;

the enable signal switching control means includes a NAND gate for calculating a NAND of the enable signals from the enable signal connection means disposed at both sides of the enable signal switching means; and the enable signal transmission direction detection means includes two NOR gates for receiving the enable signal from the enable signal connection means disposed at both sides of the enable signal switching means, respectively and for receiving each other's output as an input to the NOR gate of the other, the enable signal transmission direction detection means being a NOR latch circuit for outputting, as the bidirectional repeater control signal, a NOR calculation result obtained by each of the two NOR gates.

17. The programmable semiconductor device according to claim 14, further comprising a cooperation dynamic buffer to drive the output enable signal from the processing element means.

18. The programmable semiconductor device according to claim 17, wherein the cooperation dynamic buffer receives a timing signal, an output enable signal and an output signal from the processing element means and performs a pre-charge or pre-discharge processing according to the timing signal, and in a period where processing is not performed, performs buffer outputting according to the output enable signal, and when the output enable signal is inactive, performs buffer outputting according to a change in the output signal.

19. The programmable semiconductor device according to claim 18, wherein:

the timing signal has a configuration fixing period and a configuration modifying period; and when the timing signal is in a configuration modifying period, the output enable signal and the bidirectional repeater switching control signal are changed, and when the timing signal subsequently enters a configuration fixing period, the bidirectional repeater control signal outputted from the enable signal transmission direction detection means is determined.

20. The programmable semiconductor device according to claim 1, wherein the processing element means executes the predetermined operation according to an input control signal.

21. A programmable semiconductor device comprising:

a processing element device configured to execute a predetermined operation;

an input/output connection device configured to act as a signal input part and/or a signal output part in the processing element device;

an interconnection medium comprised of a plurality of wires configured to connect the processing element device via the input/output connection device;

a bidirectional repeater device arranged between intersection points of the interconnection medium, configured dynamically to perform disconnection, or to drive the interconnection medium in the forward direction or in the reverse direction; and an interconnection connecting device arranged at the intersection point of the interconnection medium, for connecting the interconnection medium at the intersection point.

22. The programmable semiconductor device according to claim 21, wherein the interconnection medium is comprised of wires in vertical and horizontal directions.

23. The programmable semiconductor device according to claim 21, wherein the interconnection medium is comprised of wires in vertical, horizontal and oblique directions.

24. The programmable semiconductor device according to claim 21, wherein a plurality of channels of the interconnection medium are provided.

25. The programmable semiconductor device according to claim 21, wherein the input/output connection device can be arbitrarily connected to any of the plurality of channels of the interconnection medium.

26. The programmable semiconductor device according to claim 21, wherein the interconnection connecting device is a wire connection.

27. The programmable semiconductor device according to claim 21, wherein the bidirectional repeater device includes:
a bidirectional repeater drive device configured to be driven in a forward or reverse direction; and
a bidirectional repeater control device configured to control the bidirectional repeater drive device to perform an OFF operation, or to drive the bidirectional repeater drive device in the forward direction or in the reverse direction.

28. The programmable semiconductor device according to claim 27, wherein the bidirectional repeater drive device includes a three-state buffer pair.

29. The programmable semiconductor device according to claim 27, wherein the bidirectional repeater control device includes a memory element having stored therein information on configuration of the programmable semiconductor device.

30. A programmable semiconductor device comprising:
a processing element device configured to execute a predetermined operation;
an input/output connection device configured to act as a signal input part and/or a signal output part in the processing element device;
an interconnection medium comprised of a plurality of wires configured to connect the processing element device via the input/output connection device;
a bidirectional repeater device arranged between intersection points of the interconnection medium, configured dynamically to perform disconnection, or to drive the interconnection medium in the forward direction or in the reverse direction; and
an interconnection connecting device arranged at the intersection points of the interconnection medium, configured to connect the interconnection medium at the intersection points;
wherein the bidirectional repeater device comprises:
a bidirectional repeater drive device configured to be driven in a forward or reverse direction; and
a bidirectional repeater control device configured to control the bidirectional repeater drive device to perform an OFF operation, or to drive the bidirectional repeater drive device in the forward direction or in the reverse direction; and
wherein the bidirectional repeater control device comprises:
a bidirectional repeater switching control device configured to output a bidirectional repeater switching control signal to perform an ON/OFF control of the bidirectional repeater drive device; and
a bidirectional repeater direction control device configured to receive the bidirectional repeater switching control signal from the bidirectional repeater switching control device and, at the same time, to receive an output enable signal from the processing element device and to output to the bidirectional repeater drive device a bidirectional repeater control signal to control the bidirectional repeater drive device to perform an OFF operation, or to drive the bidirectional repeater drive device in the forward direction or in the reverse direction.

31. The programmable semiconductor device according to claim 30, wherein the rest of the bidirectional repeater control device includes only a bidirectional repeater direction control device configured to receive an output enable signal from the processing element device and to output to the bidirectional repeater drive device a bidirectional repeater control signal to control the bidirectional repeater drive device to perform an OFF operation, or to drive the bidirectional repeater drive means in the forward direction or in the reverse direction.

32. The programmable semiconductor device according to claim 30, wherein the bidirectional repeater switching control device includes a memory element having stored therein information on configuration of the programmable semiconductor device.

33. A programmable semiconductor device comprising:
a processing element device configured to execute a predetermined operation;
an input/output connection device configured to act as a signal input part and/or a signal output part in the processing element device;
an interconnection medium comprised of a plurality of wires configured to connect the processing element device via the input/output connection device;
a bidirectional repeater device arranged between intersection points of the interconnection medium, configured dynamically to perform disconnection, or to drive the interconnection medium in the forward direction or in the reverse direction; and
an interconnection connecting device arranged at the intersection point of the interconnection medium, configured to connect the interconnection medium at the intersection point;
wherein the bidirectional repeater device comprises:
a bidirectional repeater drive device configured to be driven in a forward or reverse direction; and
a bidirectional repeater control device configured to control the bidirectional repeater drive device to perform an OFF operation, or to drive the bidirectional repeater drive device in the forward direction or in the reverse direction; and
wherein the bidirectional repeater control device has a configuration component which is configured to synchronize an output of the bidirectional repeater control device by use of a timing signal.

34. The programmable semiconductor device according to claim 30, wherein the bidirectional repeater direction control device includes:
an OR gate configured to calculate an OR of an output enable signal from the processing element device and an enable signal from an enable signal connection device arranged in parallel with the interconnection medium; and
an AND gate configured to calculate an AND of a calculation result obtained by the OR gate and the bidirectional repeater switching control signal from the bidirectional repeater switching control device and then to output the calculation result as the bidirectional repeater control signal.

35. The programmable semiconductor device according to claim 30, wherein the bidirectional repeater direction control device includes:
an enable signal switching device connected to an enable signal connection device arranged in parallel with the interconnection medium;
an enable signal switching control device configured to control the enable signal switching device; and
an enable signal transmission direction detection device configured to detect the direction of transmission of the enable signal from the enable signal connection device and to output the detection result as the bidirectional repeater control signal.

36. The programmable semiconductor device according to claim 35, wherein:
the enable signal switching device includes an nMOS transistor;
the enable signal switching control device includes: an AND gate configured to calculate an AND of enable signals from the enable signal connection device disposed at both sides of the enable signal switching device; and a NOR gate configured to calculate a NOR of a calculation result obtained by the AND gate and an inversion signal of the bidirectional repeater switching control signal from the bidirectional repeater switching control device; and
the enable signal transmission direction detection device includes two NOR gates configured to receive the enable signal from the enable signal connection device disposed at both sides of the enable signal switching device, respectively and at the same time, to invert and receive the bidirectional repeater switching control signal and to receive each other's output as an input to the NOR gate of the other, the enable signal transmission direction detection device being a NOR latch circuit configured to output, as the bidirectional repeater control signal, a NOR calculation result obtained by each of the two NOR gates.

37. The programmable semiconductor device according to claim 35, wherein:
the enable signal switching device includes an nMOS transistor;
the enable signal switching control device includes a NAND gate configured to calculate a NAND of the enable signals from the enable signal connection means disposed at both sides of the enable signal switching device; and
the enable signal transmission direction detection device includes two NOR gates configured to receive the enable signal from the enable signal connection device disposed at both sides of the enable signal switching device, respectively and to receive each other's output as an input to the NOR gate of the other, the enable signal transmission direction detection device being a NOR latch circuit configured to output, as the bidirectional repeater control signal, a NOR calculation result obtained by each of the two NOR gates.

38. The programmable semiconductor device according to claim 35, further comprising a cooperation dynamic buffer to drive the output enable signal from the processing element device.

39. The programmable semiconductor device according to claim 38, wherein the cooperation dynamic buffer is configured to receive a timing signal, an output enable signal and an output signal from the processing element device and to perform a pre-charge or pre-discharge processing according to the timing signal, and in a period where processing is not performed, to perform buffer outputting according to the output enable signal, and when the output enable signal is inactive, to perform buffer outputting according to a change in the output signal.

40. The programmable semiconductor device according to claim 39, wherein:
the timing signal has a configuration fixing period and a configuration modifying period; and
when the timing signal is in a configuration modifying period, the output enable signal and the bidirectional repeater switching control signal are changed, and when the timing signal subsequently enters a configuration fixing period, the bidirectional repeater control signal outputted from the enable signal transmission direction detection means is determined.

41. The programmable semiconductor device according to claim 21, wherein the processing element device is configured to execute the predetermined operation according to an input control signal.

* * * * *